United States Patent
Gromko et al.

(10) Patent No.: US 6,280,291 B1
(45) Date of Patent: Aug. 28, 2001

(54) WAFER SENSOR UTILIZING HYDRODYNAMIC PRESSURE DIFFERENTIAL

(75) Inventors: Robert Dean Gromko, Phoenix; Edmund Terry Lisi, Scottsdale, both of AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/252,007

(22) Filed: Feb. 16, 1999

(51) Int. Cl.[7] .............................. B24B 49/00; B24B 51/00
(52) U.S. Cl. ................................. 451/8; 451/9; 451/269
(58) Field of Search .................................... 451/8, 9, 269, 451/268, 262; 269/329; 73/37, 37.5

(56) References Cited

U.S. PATENT DOCUMENTS

| | | | |
|---|---|---|---|
| 3,517,641 | 6/1970 | Boyce | 118/2 |
| 3,564,568 | 2/1971 | Bunner | 29/572 |
| 3,731,524 | * 5/1973 | Langley et al. | 73/45.1 |
| 3,731,823 | 5/1973 | Goth | 216/6 |
| 3,771,267 | * 11/1973 | Fortunkski | 51/215 R |
| 3,797,889 | 3/1974 | Wilkinson | 302/2 |
| 3,962,903 | 6/1976 | Firdaus | 73/37.5 |
| 4,492,136 | * 1/1985 | Walker | 83/169 |
| 5,044,752 | 9/1991 | Thurfjell et al. | 356/400 |
| 5,163,312 | 11/1992 | Ayers | 73/37.5 |
| 5,207,416 | 5/1993 | Soler | 271/31 |
| 5,540,082 | 7/1996 | Okuyama et al. | 73/37.5 |
| 5,554,064 | 9/1996 | Brievogel et al. | 451/41 |
| 5,814,720 | * 9/1998 | Visscher | 73/37 |

* cited by examiner

*Primary Examiner*—Allan Ostrager
*Assistant Examiner*—William Hong

(57) ABSTRACT

A wafer sensor includes a wafer holder, a liquid distribution system, and a pressure sensor. The wafer holder has a hole and is configured so that a wafer being held by the wafer holder restricts the flow of liquid from the liquid distribution system through the hole. The pressure sensor has a predetermined threshold and is configured to sense the pressure of the fluid at the hole. When no wafer is present in the wafer holder, the fluid flows essentially unrestricted through the hole in the wafer holder, resulting in a relatively low pressure of the liquid in the hole. When the wafer holder holds a wafer, the restricted flow through the hole causes an increase in pressure of the liquid in the hole. This increased pressure triggers the pressure sensor, thereby indicating the presence of the wafer in the wafer holder.

38 Claims, 3 Drawing Sheets

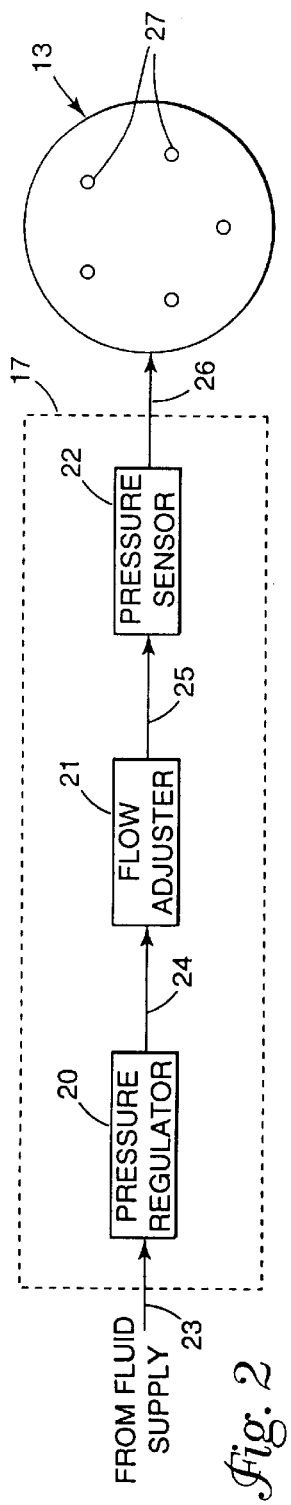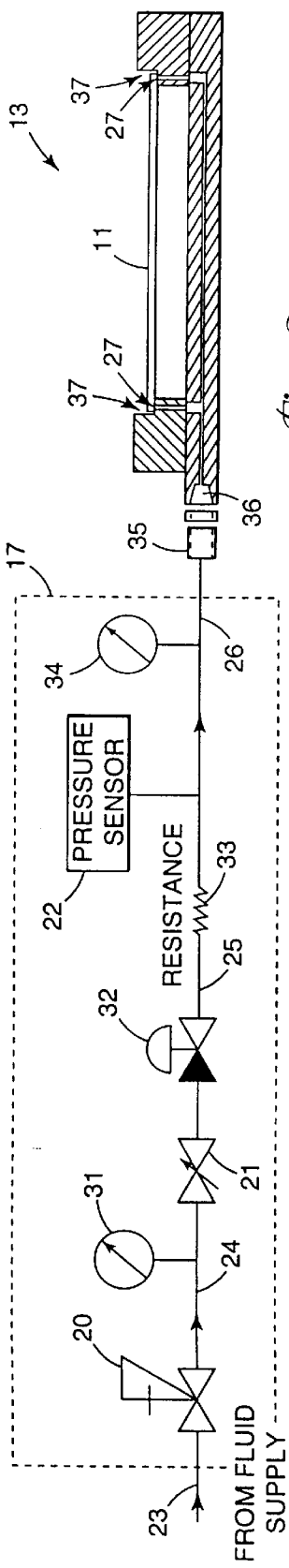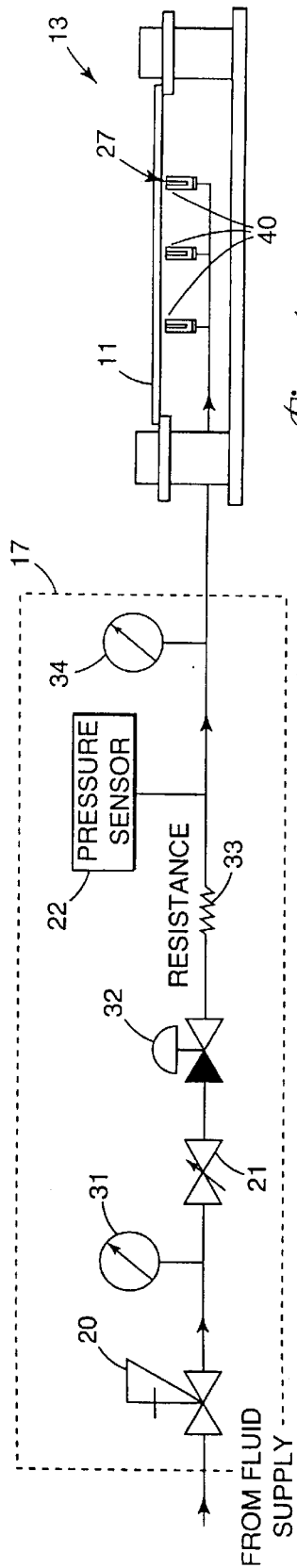

WAFER SENSOR UTILIZING HYDRODYNAMIC PRESSURE DIFFERENTIAL

FIELD OF THE INVENTION

The present invention is related to sensing devices and, more particularly, to wafer sensing devices for use with equipment used in fabricating integrated circuits.

BACKGROUND INFORMATION

Equipment or machines used in processing wafers to fabricate integrated circuits are typically automated to reduce exposure of personnel to chemicals, speed production and reduce costs. The machines often have several stations to perform various processes on the wafer and include automated wafer handling devices to move wafers between stations in a machine. Accordingly, each station and wafer handling device includes some sort of wafer holder. It is important that each station and wafer handling device be able to detect or sense whether a wafer is present in its wafer holder. Fast and accurate wafer sensing is needed to optimize the performance of the machine.

Conventional wafer sensors typically use optical sensing methods. For example, a light beam may be directed so as to impinge on a wafer present in the wafer holder. In a through beam system, a wafer present in the wafer holder would block transmission of the light beam to a light sensor. The light sensor would then indicate a wafer is present if the light beam is blocked, and would indicate the absence of a wafer if the light beam is detected. In a reflective beam system, presence of a wafer in the wafer holder would reflect a transmitted light beam to a light sensor. Thus, in this type of sensor, the light sensor would indicate the presence of the wafer if the reflected beam is detected, and would indicate the absence of a wafer if the reflected beam is not detected.

However, these optical systems are not effective in a wet environment due to refraction of the light beam by fluid in the wet environment. For example, in some types of processing machines, the wafers are kept wet when being transferred to one or more stations. Typically, in these types of systems, the processing machines wet the wafers with deionized (DI) water to keep slurry or other chemicals from drying and staining the surface prior to the controlled drying step. It can also help reduce scratching when the wafer is transferred to the wafer holder. As a result, a thin film of the DI water is formed on the wafer upon which the wafer rests in the wafer holder. This film of DI water helps reduce the risk of the wafer holder scratching the wafer. However, the DI water can cause refraction of the light beams used by optical wafer sensors, which tends to cause inaccurate sensing by the optical wafer sensors.

Another type of conventional wafer sensor uses a vacuum technique to sense the presence of a wafer. In this type of wafer sensor, holes are formed in the wafer holder through which a vacuum is drawn. A wafer present in the wafer holder would block the holes, allowing a vacuum to be formed in the holes. This vacuum would then be detected by a vacuum pressure transducer or switch. However, because air is compressible, the time required to detect the vacuum could take several seconds. This relatively long sensing time tends to undesirably reduce machine through-put. In addition, wafer warpage or particles on the wafers may prevent complete blockage of the holes, thereby preventing the vacuum from forming and causing inaccurate wafer sensing. Liquids may also enter the vacuum system and decrease reliability of wafer retention. Accordingly, there is a need for a fast, accurate wafer sensor for use in a wet environment.

SUMMARY

In accordance with the present invention, a wafer sensor is provided that uses a hydrodynamic pressure differential technique. In one embodiment, the wafer sensor includes a wafer holder, a liquid distribution system, and a pressure sensor. The wafer holder has a series of holes and is configured such that when a wafer is placed in the wafer holder, the wafer covers the holes thereby restricting the flow of liquid from the liquid distribution system through the holes. The pressure sensor has a predetermined threshold and is configured to sense the pressure of the fluid in the supply ducts supplying the holes. When no wafer is present in the wafer holder, the fluid flows essentially unrestricted through the holes in the wafer holder, resulting in a relatively low pressure of the liquid in the supply ducts. In contrast, when the wafer holder holds a wafer, the restricted flow through the holes causes an increase in pressure of the liquid in the supply ducts. This increased pressure triggers the pressure sensor, thereby indicating the presence of the wafer in the wafer holder. The liquid distribution system of the present invention advantageously allows the wafer sensor to avoid the refraction problems of conventional optical wafer sensing systems when used in a wet environment. Further, because a liquid is essentially incompressible, the response time of the wafer sensor is fast relative to conventional systems that use an evacuated air method of sensing.

BRIEF DESCRIPTION OF THE DRAWINGS

The foregoing aspects and many of the attendant advantages of this invention will become more readily appreciated by reference to the following detailed description, when taken in conjunction with the accompanying drawings listed below.

FIG. 2 is a block diagram illustrative of a wafer sensor depicted in FIG. 1, according to one embodiment of the present invention.

FIG. 3 is a schematic diagram illustrative of an implementation of the block diagram of FIG. 2, according to one embodiment of the present invention.

FIG. 4 is a schematic diagram illustrative of an implementation of the block diagram of FIG. 2, according to another embodiment of the present invention.

DETAILED DESCRIPTION

Figure 1:
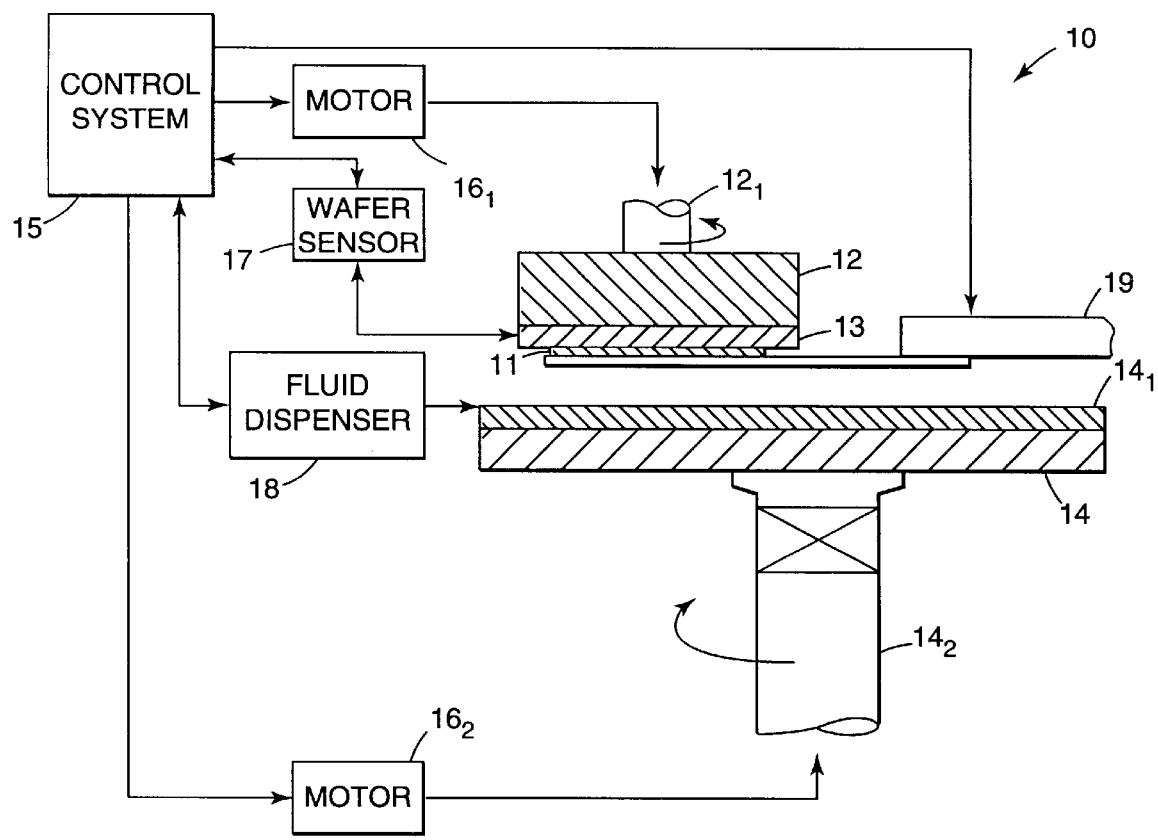
FIG. 1 is a block diagram illustrative of a polisher having a wafer sensor and wafer holder according to one embodiment of the present invention.

FIG. 1 is a block diagram illustrative of a polisher 10 for polishing a wafer 11, according to one embodiment of the present invention. The term "polisher" is used herein as a generic term that encompasses chemical-mechanical polishers, buffers and cleaners used in chemical-mechanical polishing machines. Polisher 10 includes a polish head 12 with a shaft $12_1$ and a wafer holder 13; a platen assembly 14 with a polishing pad $14_1$ and a shaft $14_2$; a control system 15;

a motor $16_1$ for imparting motion to polish head 12; motor $16_2$ for imparting motion to platen assembly 14; a wafer sensor 17; a liquid dispenser 18 and a wafer transfer device 19. Except for wafer sensor 17 and wafer holder 13, the above listed elements are conventional. In this embodiment, polisher 10 is part of a polishing station of a multi-station chemical-mechanical polishing machine, such as an Avant-Gaard 776 available from IPEC Planar, Phoenix, Arizona, with the conventional vacuum wafer sensor and wafer holder being replaced with wafer sensor 17 and wafer holder 13.

In this embodiment, wafer 11 is placed in wafer holder 13 by wafer transfer device 19 in a conventional manner. Wafer holder 13 provides a wet environment (e.g., DI water) so as to prevent wafer drying and scratching, as previously described. In accordance with the present invention, wafer sensor 17 senses the presence of wafer 11 in wafer holder 13 using a hydrodynamic pressure differential technique. As described in more detail below, this hydrodynamic pressure differential technique more accurately and quickly senses wafer 11 in wafer holder 13 than the aforementioned conventional systems in this wet environment. In this example, wafer transfer device 19 holds wafer 11 in wafer holder 13 until wafer sensor 17 senses wafer 11. This example requires that wafer transfer device 19 hold wafer 11 stable while wafer 11 is being hydrodynamically sensed by wafer sensor 17. Alternatively, the polisher may be in an "upside-down" configuration; i.e., with a wafer carrier on the bottom while the polish assembly is on top, in a manner similar to the polishers disclosed in U.S. Pat. Nos. 5,735,731 and 5,810,964. In this alternative example, wafer transfer device 19 may simply place wafer 11 into wafer holder 13, which advantageously allows the weight of wafer 11 to keep wafer 11 in wafer holder 13 while being hydrodynamically sensed by wafer sensor 17. Wafer sensor 17 then provides a sense signal to control system 15 to indicate that wafer 11 is detected in wafer holder 13.

Control system 15 causes liquid dispenser 18 to provide polish fluid to the surface of polishing pad $14_1$. In this embodiment, liquid dispenser 18 provides slurry or other polishing/cleaning fluids through holes in polishing pad $14_1$, depending on the process being performed by polisher 10. In other embodiments, the polish fluid is dispensed through a nozzle or sprayer directly onto the polishing surface of polishing pad $14_1$. Control system 15 also provides control signals to motors $16_1$ and $16_2$ so that polish head 12 rotates about shaft $12_1$ and platen assembly 14 moves in an orbital or circular path. This polishing motion is well known, as disclosed in U.S. Pat. No. 5,554,064 issued Sep. 10, 1996. In addition, control system 15 causes polish head 12 to move into contact with polishing pad $14_1$ to polish wafer 11 in a conventional manner.

Although an orbital polisher application is described, those skilled in the art of chemical-mechanical polishers, in view of the present disclosure, can without undue experimentation implement other embodiments for use in essentially any type of machine that requires wafer sensing. For example, other embodiments may be adapted for use in chemical-mechanical polishers with non-orbital polishing motions (e.g., rotational or linear as disclosed in U.S. Pat. Nos. 5,702,291 and 5,692,947) or in single-wafer transfer devices (e.g., robot arms, conveyors, linear track mechanisms, etc.).

Figure 1A:
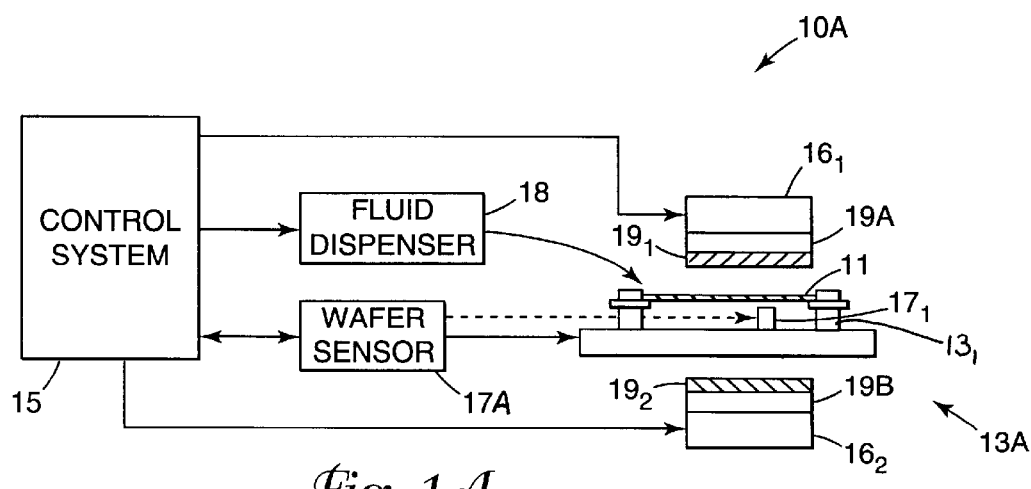
FIG. 1A is a block diagram illustrative of a polisher having a wafer sensor and wafer holder, according to another embodiment of the present invention.

FIG. 1A is a block diagram illustrative of a polisher 10A for buffing wafer 11, according to another embodiment of the present invention. For clarity, the same reference numbers are used between drawings to indicate elements having the same or similar function or structure. In this embodiment, polisher 10A is part of a buffing station of a multi-station chemical-mechanical polishing machine, such as an AvantGaard 776 available from IPEC Planar, Phoenix, Ariz. Polisher 10A also includes control system 15, liquid dispenser 18, motors $16_1$ and $16_2$, buff pad assembly 19A with buff pad $19_1$, and buff pad assembly 19B with buff pad $19_2$. As indicated by the dashed line in FIG. 1A, in this embodiment, wafer sensor 17A includes a nozzle $17_1$ that is positioned on wafer holder 13A below wafer 11. In addition, wafer holder 13A includes flanged columns $13_1$. When placed in wafer holder 13A, wafer 11 rests on the flanges of flanged columns $13_1$.

During a buffing process, control system 15 causes liquid dispenser 18 to dispense the process fluids required by the process recipe. In addition, control system 15 controls motors $16_1$ and $16_2$ to rotate buff pads $19_1$ and $19_2$, respectively, while causing buff pad assemblies 19A and 19B to come into contact with wafer 11. Motor $16_1$ also provides a down force on buff assembly 19A onto wafer 11. Buff assembly 19B is kept substantially stationary to oppose this down force, which facilitates buffing. Wafer sensor 17A operates in conjunction with wafer holder 13A in substantially the same manner as wafer sensor 17 (FIG. 1) and wafer holder 13 (FIG. 1) as described above for polisher 10 (FIG. 1). Those skilled in the art of chemical-mechanical polishing machines will appreciate that a similar arrangement can be used in cleaning stations of a chemical-mechanical polishing machine. Still further, in light of this disclosure, those skilled in the art of integrated circuit fabrication equipment can, without undue experimentation, implement other embodiments of the wafer sensor for use in other types of wafer processing equipment.

FIG. 2 is a block diagram illustrative of wafer sensor 17 (FIG. 1), according to one embodiment of the present invention. This embodiment of wafer sensor 17 includes a pressure regulator 20, a flow adjuster 21 and a pressure sensor 22. Pressure regulator 20 is connected to receive liquid from a fluid supply (not shown) through a standard high-pressure hose 23. The fluid supply is conventional and provides the liquid at relatively high pressure. In one embodiment, the fluid supply provides the liquid at a pressure generally less than 100 PSIG. Pressure regulator 20 is a conventional hydraulic pressure regulator used to control the pressure in a hose 24 to desired level. Any suitable pressure regulator may be used to implement pressure regulator 20 such as, for example, a UPRM688-60-M available from Furon, Anaheim, Calif.

The liquid then flows from pressure regulator 20 to flow adjuster 21 through hose 24. Flow adjuster 21 is a conventional hydraulic flow adjuster and adjusts the volume-output liquid flow in a hose 25 to a desired level, accompanied by a corresponding small decrease in pressure in hose 25. Any suitable flow adjuster may be used to implement flow adjuster 21 such as, for example, a PV 6-24 available from Furon. In light of this disclosure, those skilled in the art can, will appreciate that flow adjuster 21 may not be needed if the line sizes and initial pressure regulator settings provide a suitable dynamic range of pressure differential when a wafer is and is not present in the wafer holder. In a further refinement (not shown in FIG. 2), after flow adjuster 21, a resistance can be added. As the liquid flows through the resistance, the flowing pressure drops to approximately 2–4 PSIG. This resistance allows for reliability and repeatability. A fixed orifice, or specific length of very small diameter 5/32" or 1/8" tubing can be used as the resistance. When cut to a specific length, the tubing has very repeatable resistance characteristics, which is very desirable in mass production.

Referring back to FIG. 2, hose 25 is connected to provide the pressure-regulated and flow-adjusted liquid to pressure sensor 22. Pressure sensor 22 is a conventional hydraulic pressure switch or transducer and monitors the pressure of the liquid in hose 25. Any suitable pressure switch or transducer may be used to implement pressure sensor 22 such as, for example, a 0–5 millivolt DC pressure transducer available from Omega, Stamford, Conn. Pressure sensor 22 is connected to wafer holder 13 through a hose 26. Ideally, pressure sensor 22 is located as near as possible to wafer holder 13 to more accurately monitor the pressure of the liquid flow at wafer holder 13. Pressure sensor 22 is configured as a switch to be triggered when the liquid pressure in hose 26 reaches a predetermined threshold. Alternatively, pressure sensor 22 can be configured as a transducer to provide electrical analog signal having a parameter (e.g., voltage) that depends on the sensed pressure. By this latter method, control system 15 measures the parameter and can be programmed to determine the pressure corresponding to value of the parameter. In this way, control system 15 can sense the pressure of the liquid over a wide range of pressures and make the present/not present logic decision by software programming.

The liquid then flows from hose 26 into wafer holder 13 through a number of bubbler holes 27. Bubbler holes 27 are formed in wafer holder 13 so that a wafer properly placed in wafer holder 13 covers holes 27. In this embodiment, the wafer is placed in wafer holder 13 so that the plane of the wafer is essentially parallel to the ground. Thus, the weight of the wafer keeps the wafer against bubbler holes 27. The number and size of bubbler holes 27 are predetermined in conjunction with the pressure regulator and flow adjuster settings so that force exerted by the liquid against the wafer is less than or nearly equal to the weight of the wafer. When no wafer is present in wafer holder 13, the liquid flows freely out of bubbler holes 27, resulting in a relatively low pressure (i.e., below the predetermined threshold of pressure sensor 22) in hose 26. In contrast, when a wafer is present in wafer holder 13, the liquid flow is significantly reduced, which causes the static pressure in hose 26 to increase above the predetermined threshold of pressure sensor 22. Pressure sensor 22 is then triggered, which causes a signal to be propagated to control system 15 that indicates that a wafer is present in wafer holder 13. Control system 15 can then initiate the wafer polishing process (e.g., chemical-mechanical polishing, buffing, cleaning, etc.).

FIG. 3 is a schematic diagram illustrative of an implementation of wafer sensor 17 (FIG. 2), according to one embodiment of the present invention. In this embodiment, wafer sensor 17 includes a pressure gauge 31, a valve 32, a resistance 33, a pressure gauge 34 and a fitting 35, as well as pressure regulator 20, flow adjuster 21 and pressure sensor 22. This embodiment operates generally as described above in conjunction with FIG. 2. Thus, liquid at about 100 PSIG is received by pressure regulator 20, which provides the liquid to flow adjuster 21 at a reduced pressure of about 5–20 PSIG, via line 24. Pressure gauge 31 is connected to monitor the pressure of the liquid received by flow adjuster 21 from pressure regulator 20. Pressure gauge 31 can be any suitable hydraulic pressure gauge such as, for example a 5342–015 Gauge and Gauge Guard available from Ryan Herco, Burbank, Calif.

Flow adjuster 21 receives the flow of liquid from line 24 and outputs the liquid flow into line 25 with reduced volume flow. Valve 32 is connected to line 25 to selectively cutoff the flow of liquid through line 25. Valve 32 can be any suitable remotely actuated valve such as, for example, a two way, normally closed UPM2-644NC air-piloted valve available from Furon. More specifically, in this embodiment, valve 32 is connected at the output port of flow adjuster 21 and is used to activate and de-activate wafer sensor 17 by turning on and shutting off liquid flow to bubbler holes 27. An air-piloted valve is used in this embodiment to take advantage of the remote control system which also communicates with a vacuum operated wafer transfer device used to place wafer 11 into wafer holder 13. Valve 32 is activated and de-activated after receiving a control signal from control system 15. This control signal depends in part on the output signal of pressure switch 22. In this embodiment, air piloted valve 32 is turned on to allow fluid flow in the bubbler holes 27 whenever the wafer transfer device is commanded to deliver a wafer or retrieve a wafer from the wafer holder. More specifically, when transferring a wafer, control system 15 causes the vacuum to be present in the wafer transfer device. Control system 15 monitors the vacuum and based on the presence or absence of vacuum, control system 15 appropriately executes on/off commands to turn on valve 32 and thereby activate wafer sensor 17. Then when a wafer is placed in holder 13, the vacuum in the wafer transfer device is turned off, which then turns off wafer sensor 17. In a further refinement used in retrieving a wafer from wafer holder 13, the vacuum in the wafer transfer device can be monitored by control system 15 to appropriately turn on or off wafer sensor 17 in a similar manner.

The liquid flowing in line 25 is then received by resistance 33, which reduces the flowing pressure passing pressure sensor 22. Resistance 33 can be implemented in any suitable manner to further restrict liquid flow. In this embodiment, resistance 33 is implemented with a fixed orifice. For example, the fixed orifice can be implemented by reducing the cross-sectional flow area of tube 25 and choosing a specific length of tube 25 to create desired resistance. As a result, the flowing pressure is sharply reduced to a level of about one to four PSIG as the liquid flows by pressure sensor 22 and to bubbler holes 27. The use of pressure regulator 20, flow adjuster 21 and resistance 33 allows the flowing pressure to be more tightly controlled, predictable and uniform. Pressure gauge 34 is connected to measure the fluid pressure at pressure sensor 22. In this embodiment, pressure gauge 34 is identical to pressure gauge 31. Pressure gauges 34 and 31 allow the operator to verify that wafer sensor 17 is operating properly.

When bubbler holes 27 are covered by wafer 11, fluid flow passing pressure sensor 22 is reduced, resulting in an increased pressure at that point. The greater the flow reduction, the greater the pressure increase. The maximum pressure obtainable would be at "zero flow" conditions in which case the maximum pressure would be about equal to the output pressure from pressure regulator 20.

Pressure sensor 22 is connected in close proximity to fitting 35 so that the pressure used for sensing the presence or absence of a wafer is essentially equal to the fluid pressure in bubbler holes 27 of wafer holder 13. In particular, as fluid flows through resistance 33 and past pressure sensor 22, the fluid enters wafer holder 13 through fitting 35 and flows through a passage 36 formed in wafer holder 13 through holes 27. In this embodiment, bubbler holes 27 are formed in a fixed position on a ledge 37 formed on the walls of wafer holder 13. Pressure sensor 22 can be any suitable pressure sensor such as, for example, a 1–5 volt DC pressure transducer available from Omega. The trigger threshold of pressure sensor 22 is set to be at about the midpoint between the expected pressures when wafer 11 is absent and present.

FIG. 4 is a schematic diagram illustrative of wafer sensor 17 and wafer holder 13 (FIG. 2), according to another embodiment of the present invention. In this embodiment, wafer sensor 17 is essentially the same as the embodiment of wafer sensor 17 described above in conjunction with FIG. 3. However, in this embodiment, wafer holder 13 has adjustable nozzles 40 with bubbler holes 27 instead of the fixed position of bubbler holes 27 as in the embodiment of FIG. 3. Nozzles 40 can be adjusted in both position and in height to optimize performance of wafer sensor 17. Other than adjustment of nozzles 40, this embodiment of wafer sensor 17 operates in substantially identical fashion as described above for the embodiment of FIG. 3.

Figure 5:
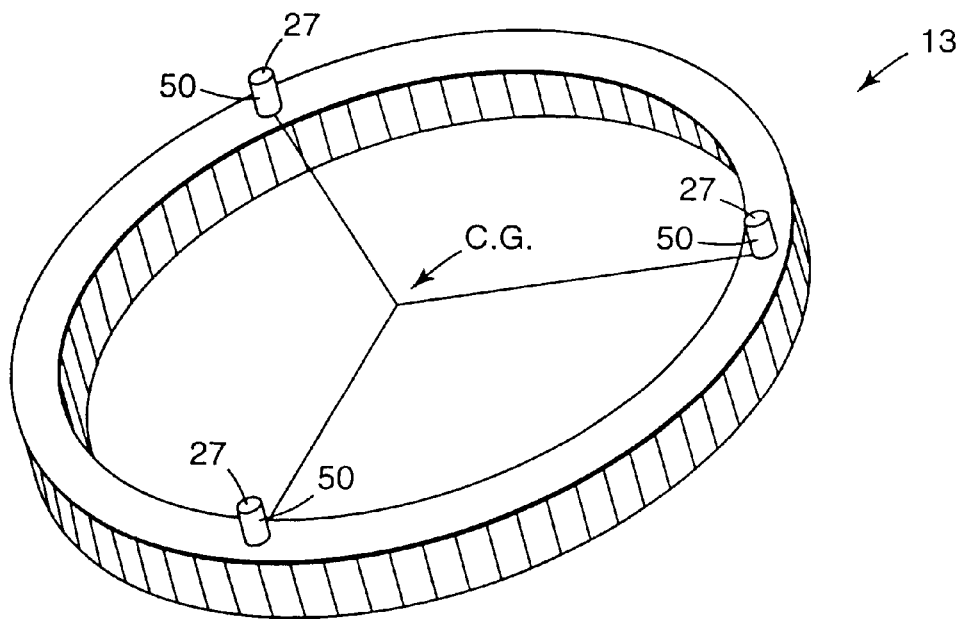
FIG. 5 is a diagram illustrative of the wafer holder depicted n FIG. 3, according to another embodiment of the present invention.

FIG. 5 is a diagram illustrative of wafer holder 13, according to another embodiment of the present invention. This embodiment of wafer holder 13 is substantially similar to wafer holder 13A (FIG. 1A) except that nozzles 50 are used instead of flanged columns $13_1$ and nozzles $17_1$. Nozzles 50 operate in the same manner as nozzles $17_1$, but with wafer 11 resting on top of nozzles 50 instead of the flanges of flanged columns $13_1$. Thus, nozzles 50 combine the functions of flanged columns $13_1$ and nozzles $17_1$. In this embodiment, nozzles 50 are equally spaced about the center of gravity of the wafer when the wafer is placed in wafer holder 13. This distribution of nozzles 50 helps balance the forces applied to the wafer when the liquid is flowing through nozzles 50 so that the wafer does not "tilt" and allow liquid to flow out of one or more of nozzles 50 and reduce the pressure at the pressure sensor.

Figure 6:
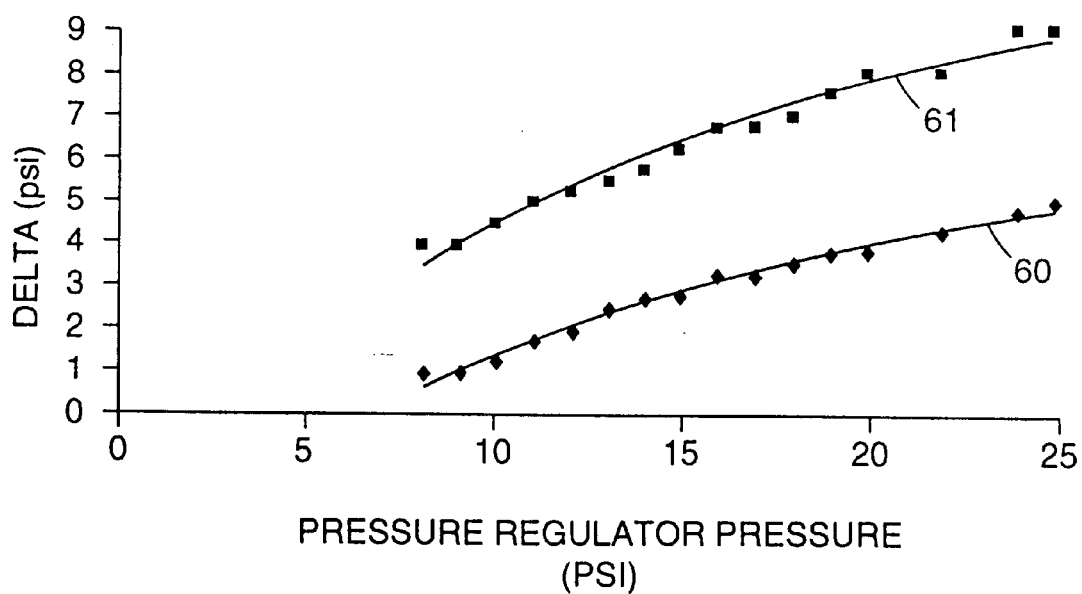
FIG. 6 is a graph illustrating the pressure difference at the pressure sensor when a wafer is present and not present in the wafer holder.

FIG. 6 is a graph illustrating the pressure difference at pressure sensor 22 (FIG. 2) when a wafer is present and not present in the wafer holder 13 (FIG. 2). Waveform 60 represents the magnitude of the pressure at pressure sensor 22 when no wafer is present in wafer holder 13 for various settings of pressure regulator 20 (FIG. 2). Waveform 61 represents the magnitude of the pressure at pressure sensor 22 when a wafer is present in wafer holder 13 for various settings of pressure regulator 20. As shown in FIG. 6, when pressure regulator 20 is set at about twenty PSI static pressure, there is a difference of about four PSI between waveforms 60 and 61. In particular, the pressure when no wafer present is about four PSI whereas the pressure when a wafer is present is about eight PSI. Thus, pressure sensor 22 would be monitored or calibrated to trigger at about six PSI (i.e., midway between eight PSI and four PSI) to provide a ±two PSI "noise" margin. Those skilled in the art will appreciated that the specific pressure values will depend on the many factors, such as the length and diameter of the hoses, the number and size of bubbler holes 27 (FIG. 2) and relative vertical positions of various components in wafer sensor 17 and wafer holder 13. Vertical positions or relative elevations of components will cause different pressures to occur for different applications since static wafer pressure will vary by approximately 0.433 PSI per foot of elevation difference between any two locations in a hydraulic piping system.

The embodiments of the wafer sensor described above are illustrative of the principles of the present invention and are not intended to limit the invention to the particular embodiments described. For example, those skilled in the art of integrated circuit processing equipment, in light of this disclosure, can implement, without undue experimentation, other embodiments of this method of wafer detection anywhere wet processing of wafers occurs. The working fluid of such a system can be DI water, regular tap water, and any other fluid that can easily flow through tubing, valves and other distribution and control components. Typically, such fluids will have fluid viscosities in the range of one centistoke (water) to 1000 centistokes (comparable to SAE 70 grade motor oil at 100 degrees Fahrenheit). In addition to sensing wafers, other embodiments of the present invention can be adapted for use in sensing any type of workpiece. For example, a workpiece may be a semiconductor wafer, a bare silicon or other semiconductor substrate with or without active devices or circuitry, a partially processed wafer, a silicon on insulator, a hybrid assembly, a flat panel display, a Micro-electronic modules (MEMs), a MEAMS wafer, a disk for a hard drive memory, or any other material that would benefit from planarization. Accordingly, while the preferred embodiment of the invention has been illustrated and described, it will be appreciated that various changes can be made therein without departing from the spirit and scope of the invention.

We claim:

1. A system for sensing the presence of a workpiece, the system being incorporated into a workpiece processing machine, used in fabricating integrated circuits, the system comprising:
    a holder having a hole, wherein the holder is configured to hold a workpiece in a position to restrict fluid flow through the hole;
    a liquid distribution system configured to distribute a liquid through the hole of the holder; and
    a pressure sensor coupled to the liquid distribution system, wherein the pressure sensor is configured to detect whether the liquid in the hole has a pressure exceeding a predetermined threshold.

2. The system of claim 1 wherein when a workpiece is present in the holder, the workpiece restricts flow of the liquid through the hole so that the liquid in the hole has a pressure exceeding the predetermined threshold and wherein when no workpiece is present in the holder, the liquid flowing through the hole has a pressure below the predetermined threshold.

3. The system of claim 1 wherein the holder has a plurality of holes, the holder being configured to hold a workpiece in position to restrict flow through the plurality of holes.

4. The system of claim 1 wherein the system is incorporated into a chemical-mechanical polishing machine and wherein the liquid is deionized water.

5. The system of claim 4 wherein the holder is part of a chemical-mechanical polisher, buffer, or cleaner of the chemical-mechanical polishing machine.

6. The system of claim 5 wherein the distribution system is configured to distribute the liquid to the hole at a pressure that causes the liquid to exert a force on the workpiece that is less than or equal to the weight of the workpiece.

7. The system of claim 1 wherein the holder is configured to hold a workpiece so that the workpiece rests in the holder on top of the hole.

8. The system of claim 7 wherein the liquid distribution system is configured to distribute the liquid to the hole at a pressure that causes the liquid to exert a force on the workpiece that is less than or equal to the weight of the workpiece.

9. The system of claim 1 wherein the holder includes a nozzle device coupled to the liquid distribution system, the nozzle having the hole.

10. The system of claim 9 wherein the holder further includes a plurality of flanged columns, the holder being configured so that when the holder is holding a workpiece, the workpiece rests on the flanges of the columns.

11. The system of claim 9 wherein the holder is configured so that when the holder is holding a workpiece, the workpiece rests on the nozzle device.

12. The system of claim 1 wherein the liquid has a viscosity in the range of 1–1000 centistokes.

13. A chemical-mechanical polishing machine comprising:
- a workpiece holder having a hole, wherein the holder is configured to hold a workpiece in a position to restrict fluid flow through the hole and positioned so that a first surface of the workpiece is exposed;
- a pad assembly configurable to be positioned in an operative relationship with the workpiece holder wherein the first surface of a workpiece held in the workpiece holder is placed in contact with an operative surface of the pad assembly;
- a motor configured to impart a motion between the operative surface of the pad assembly and the workpiece holder;
- a dispenser system configured to provide a fluid to an interface between the first surface of the workpiece and the operative surface of the pad assembly;
- a control system coupled to the workpiece holder, the dispenser, and the motor, wherein the control system is configured to provide control signals used in coordinating the operation of the workpiece holder, the dispenser and the motor; and
- a workpiece sensor system coupled to the control system, the workpiece sensor system comprising:
  - a liquid distribution system coupled to the workpiece holder, wherein the liquid distribution system is configured to distribute a liquid through the hole of the workpiece holder; and
  - a pressure sensor coupled to the liquid distribution system, wherein the pressure sensor is configured to provide a signal to the control system indicating whether a portion of the liquid at the hole has a pressure exceeding a predetermined threshold.

14. The chemical-mechanical polishing machine of claim 13 wherein when a workpiece is present in the workpiece holder, the workpiece restricts flow of the liquid through the hole so that a portion of the liquid at the hole has a pressure exceeding the predetermined threshold and wherein when no workpiece is present in the workpiece holder, the liquid flowing through the hole has a pressure below the predetermined threshold.

15. The chemical-mechanical polishing machine of claim 13 wherein the workpiece holder, pad assembly, dispenser, and motor form part of a chemical-mechanical polisher, buffer or cleaner of the chemical-mechanical polishing machine.

16. The chemical-mechanical polishing machine of claim 13 wherein the liquid is deionized water.

17. The chemical-mechanical polishing machine of claim 13 wherein the liquid has a viscosity in the range of 1 to 1000 centistokes.

18. The chemical-mechanical polishing machine of claim 13 wherein the workpiece holder is configured to hold a workpiece so that the workpiece rests in the holder on top of the hole.

19. The chemical-mechanical polishing machine of claim 18 wherein the liquid distribution system is configured to distribute the liquid to the hole at a pressure that causes the liquid to exert a force on the workpiece that is less than or equal to the weight of the workpiece.

20. The chemical-mechanical polishing machine of claim 13 wherein the workpiece holder includes a nozzle coupled to the liquid distribution system, the nozzle having the hole.

21. The chemical-mechanical polishing machine of claim 20 wherein the nozzle is adjustable in position on the workpiece holder.

22. The chemical-mechanical polishing machine of claim 20 wherein the workpiece holder is configured so that when the workpiece holder is holding a workpiece, the workpiece rests on the nozzle.

23. The chemical-mechanical polishing machine of claim 20 wherein the workpiece holder further includes a plurality of flanged columns, the workpiece holder being configured so that when the workpiece holder is holding a workpiece, the workpiece rests on the flanges of the plurality of columns.

24. A method of sensing the presence of a workpiece for use in a workpiece processing machine, used in fabricating integrated circuits, the workpiece processing machine having a workpiece holder, the method comprising:
- distributing a liquid to the workpiece holder through a hole in the workpiece holder, wherein when a workpiece in present in the workpiece holder, the workpiece restricts flow through the hole and when no workpiece is in the workpiece holder, the liquid flows essentially unrestricted through the hole; and
- detecting whether a portion of the liquid at the hole has a pressure exceeding a predetermined threshold.

25. The method of claim 24 wherein when a workpiece is present in the holder, the workpiece restricts flow of the liquid through the hole so that a portion of the liquid at the hole has a pressure exceeding the predetermined threshold and wherein when no workpiece is present in the holder, the liquid flowing through the hole has a pressure below the predetermined threshold.

26. The method of claim 24 wherein the holder has a plurality of holes, the holder being configured to hold a workpiece in a position to restrict flow through the plurality of holes.

27. The method of claim 24 wherein the system is incorporated into a chemical-mechanical polishing machine.

28. The method of claim 24 wherein the liquid has a viscosity in the range of 1 to 1000 centistokes.

29. The method of claim 28 wherein the liquid is deionized water.

30. The method of claim 24 wherein the holder is configured to hold a workpiece so that the workpiece rests in the holder on top of the hole.

31. The method of claim 30 wherein distributing the liquid to the workpiece holder comprises distributing the liquid to the hole of the workpiece holder at a pressure that causes the liquid to exert a force on the workpiece that is less than or equal to the weight of the workpiece.

32. A system for sensing the presence of a workpiece, the system being incorporated into a workpiece processing machine used in fabricating integrated circuits, the system comprising:
- distribution means for distributing a liquid;
- holding means, coupled to the distribution means with a hole in the holding means communicating with the distribution means, for holding a workpiece in a position to restrict flow through the hole; and
- sensing means for sensing whether the liquid at the hole has a pressure exceeding a predetermined threshold.

33. The system of claim 32 wherein when a workpiece is present in the holding means, the workpiece restricts flow of the liquid through the hole so that the liquid has a pressure at the hole exceeding the predetermined threshold and wherein when no workpiece is present in the holder, the liquid flowing through the hole has a pressure below the predetermined threshold.

34. The system of claim 32 wherein the holder has a plurality of holes, the holder being configured to hold a workpiece in position to restrict flow through the plurality of holes.

35. The system of claim 32 wherein the system is incorporated into a chemical-mechanical polishing machine.

36. The system of claim 32 wherein the liquid has a viscosity ranging from 1 to 1000 centistokes.

37. The system of claim 36 wherein the liquid is deionized water and the workpiece is a semiconductor wafer.

38. The system of claim 32 wherein the holding means is configured to hold a workpiece so that the workpiece rests in the holding means on top of the hole.

\* \* \* \* \*